(12) United States Patent
Lasich (10) Patent No.: US 9,793,428 B2
(45) Date of Patent: Oct. 17, 2017

(54) PHOTOVOLTAIC CELL MODULE HEAT EXTRACTION ASSEMBLY (75) Inventor: John Beavis Lasich, Balwyn (AU)

(73) Assignee: REYGEN RESOURCES PTY LTD, Malvern, Victoria (AU)

(*) Notice: Subject to any disclaimer, the term of this patent is extended or adjusted under 35 U.S.C. 154(b) by 671 days.

(21) Appl. No.: 13/876,634

(22) PCT Filed: Sep. 28, 2011

(86) PCT No.: PCT/AU2011/001246
§ 371 (c)(1),
(2), (4) Date: Mar. 28, 2013

(87) PCT Pub. No.: WO2012/040780
PCT Pub. Date: Apr. 5, 2012

(65) Prior Publication Data
US 2013/0240017 A1 Sep. 19, 2013

(30) Foreign Application Priority Data
Sep. 28, 2010 (AU) .............................. 2010904355

(51) Int. Cl.
H01L 31/052 (2014.01)
H01L 31/18 (2006.01)
(Continued)

(52) U.S. Cl.
CPC .......... *H01L 31/0521* (2013.01); *F24J 2/202* (2013.01); *H01L 31/054* (2014.12);
(Continued)

(58) Field of Classification Search
CPC . H01L 31/052; H01L 31/0521; H01L 31/054; H01L 31/0547; H01L 31/18;
(Continued)

(56) References Cited

U.S. PATENT DOCUMENTS 3,325,312 A * 6/1967 Sonntag, Jr. ............ H01L 35/06
136/212
4,361,717 A 11/1982 Gilmore
(Continued)

FOREIGN PATENT DOCUMENTS

WO WO2008094555 A2 8/2008

OTHER PUBLICATIONS

Authorized officer Ben Tuohy, International Search Report in PCT/AU2011/001246, mailed Nov. 17, 2011, 4 pages.

Primary Examiner — Susan D Leong
(74) Attorney, Agent, or Firm — Morrison & Foerster LLP (57) ABSTRACT An assembly for extracting heat from a photovoltaic cell assembly for a receiver of a solar radiation-based electrical power generating system is disclosed. The assembly comprises a coolant chamber and a coolant member in the form of a plurality of heat transfer fingers of high thermal conductivity material that are located in the coolant chamber. The fingers have ends that are in thermal contact with the photovoltaic cell assembly and thereby facilitate heat transfer away from the assembly. The fingers are sufficiently flexible to accommodate differences in thermal expansion coefficient between the object and the fingers. The fingers have a relatively high surface area for heat transfer from the fingers to coolant that, in use, circulates through the coolant chamber.

16 Claims, 5 Drawing Sheets (51) Int. Cl.
*F24J 2/20* (2006.01)
*H01L 31/054* (2014.01)

(52) U.S. Cl.
CPC .......... *H01L 31/0547* (2014.12); *H01L 31/18* (2013.01); *Y02E 10/44* (2013.01); *Y02E 10/52* (2013.01)

(58) Field of Classification Search
CPC ... H01L 33/64; H01L 33/648; H01L 45/1286; H01L 51/529
See application file for complete search history.

(56) References Cited

U.S. PATENT DOCUMENTS

| | | | |
|---|---|---|---|
| 4,830,678 A | 5/1989 | Todorof | |
| 2005/0016581 A1 | 1/2005 | Fujisaki et al. | |
| 2005/0081908 A1* | 4/2005 | Stewart | H01L 31/035281 136/246 |
| 2006/0288708 A1* | 12/2006 | Maltezos | F25B 21/04 62/3.3 |
| 2007/0089775 A1 | 4/2007 | Lasich | |
| 2009/0025712 A1 | 1/2009 | Grip | |

* cited by examiner

PHOTOVOLTAIC CELL MODULE HEAT EXTRACTION ASSEMBLY

The present invention relates to an assembly for extracting heat from an object.

The present invention relates generally to extracting heat from objects in situations where high rates of heat transfer are required in relatively confined spaces with low energy input to extract the heat.

One such situation is the extraction of heat from an array of photovoltaic cells in a concentrated solar radiation-based electrical power generating system and the present invention is described hereinafter, by way of example, in the context of this application but is not limited to this application.

Solar radiation-based electrical power generating systems typically include:

(a) a receiver that includes an array of photovoltaic cells for converting solar energy into electrical energy, (b) an electrical circuit for transferring an electrical energy output of the photovoltaic cells to an end-use application for the electrical energy; and (c) a concentrator for concentrating solar radiation onto the photovoltaic cells of the receiver.

The present invention is applicable particularly, although by no means exclusively, to large scale solar radiation-based electrical power generating systems of the type described above that are capable of producing substantial amounts of electrical power ready for conditioning to at least 20 kW of standard 3 phase 415 volt AC power.

End-use applications for such large scale power generating systems include remote area power supply for isolated grids, mains grid-connected power, water pumping, telecommunications, crude oil pumping, water purification, and hydrogen generation.

One significant issue associated with the development of commercially viable solar radiation-based electrical power generating systems of the type described above is being able to extract sufficient heat from the photovoltaic cell array to facilitate long term performance of materials of the cell array in situations in which there is:

(a) exposure to high intensity solar radiation capable of producing high temperatures, i.e. temperatures typically considerably above 1000° C.;

(b) cycling between high and low intensities of solar radiation and hence cycling between high and low cell array temperatures, i.e. typically between 20-50° C. in some situations and 20 to 150° C. in other situations;

(c) temperature variations between different parts of the cell array at any given point in time, i.e. typically a ΔT of 30° C. in some situations and as high as 130° C. in other situations; and (d) different thermal expansion coefficients of different materials that make up the cell array and associated components.

In large scale solar radiation-based electrical power generating systems of the type described above the photovoltaic cells are exposed to solar radiation intensities of at least 200 times the intensity of the Sun during optimum operating conditions. In addition, the photovoltaic cells are subjected to significant cycling between high and low levels of solar radiation and hence temperatures and to variations in solar radiation intensity and hence temperature across the surface of the receiver and through the components of the receiver from the exposed face of the receiver.

It is evident from the above that extracting sufficient heat from photovoltaic cell arrays is a significant issue.

The above description is not to be taken as an admission of the common general knowledge in Australia and elsewhere.

In general terms, the present invention provides an assembly for extracting heat from an object, such as a photovoltaic cell assembly for a receiver of a solar radiation-based electrical power generating system. The assembly comprises a coolant chamber that is behind the object and a coolant member in the form of a plurality of heat transfer fingers of high thermal conductivity (typically greater than 100 W/m ° C.) material that are located in the coolant chamber. The fingers have ends that are in thermal contact with the object, and thereby facilitate heat transfer away from the object. The ends of the fingers are connected directly or indirectly to the object, whereby the fingers support the assembly. The fingers are sufficiently flexible (typically sufficient to survive a transverse movement of up to 10%, more typically at least 20%, of the width of the fingers) to accommodate differences in thermal expansion coefficient between the object and the fingers in use of the object. In addition, the fingers have a relatively high surface area (i.e. typically greater than 5 to 10 times the area of the photovoltaic cells being cooled by the fingers) for heat transfer from the fingers to coolant that in use circulates through the coolant chamber.

More particularly, the present invention provides a photovoltaic cell module for a receiver of a solar radiation-based electrical power generating system comprising:

(a) a photovoltaic cell assembly that includes at least one photovoltaic cell having an exposed surface for solar radiation;

(b) an electrical connection for transferring an electrical energy output of the photovoltaic cell assembly to an output electrical circuit, and (c) an assembly for extracting heat from the photovoltaic cell, the assembly comprising a coolant chamber positioned behind the exposed surface of the photovoltaic cell assembly having a coolant inlet and a coolant outlet for coolant to be supplied into the chamber and for heated coolant to be removed from the chamber and a coolant member located in the coolant chamber to support the photovoltaic cell assembly and to facilitate heat transfer from the assembly to coolant in the chamber located in the coolant chamber, the coolant member comprising a plurality of heat transfer fingers of high thermal conductivity material having ends that are connected directly or indirectly to the photovoltaic cell assembly and supporting the photovoltaic cell assembly and for transferring heat from the photovoltaic cell assembly to coolant in the coolant chamber, the fingers being sufficiently flexible to accommodate differences in thermal expansion coefficient between the photovoltaic cell assembly and the fingers and having a relatively high surface area for heat transfer from the fingers to coolant circulating through the coolant chamber.

The term "fingers" is understood herein to mean any suitable elongate elements. It is important to define the term "fingers" in the context of the cell module within the solar radiation-based electrical power generation system. As is indicated above, one purpose of the fingers is to facilitate heat transfer from the photovoltaic cells to the coolant. Another purpose of the fingers is to be sufficiently flexible along the length of the fingers to accommodate expansion and contraction in the photovoltaic cell assembly and the module generally with temperature changes during the course of operation of the solar radiation-based electrical power generating system. Moreover, as is indicated above, the photovoltaic cell assembly is exposed to (a) very high solar radiation intensity which could produce temperatures typically up to 1000° C., (b) significant temperature variations across the cells or through the cell assembly at any given time, i.e. typically a ΔT of 30° C. in some situations and as high as 130° C. in other situations, and (c) substantial temperature variations of the cells during the course of each day, i.e. typically between 20-50° C. in some situations and 20 to 150° C. in other situations. Therefore, any differences, albeit small, in relative temperature or the thermal expansion coefficients of the materials (and/or the neighbouring components) from which the module is constructed can produce strain in the module that can adversely affect the structural integrity (for example the waterproofness of the coolant chamber) and therefore the operating life of the module. This is particularly the case given the cyclic nature of operation of the system. Typically, operating periods of 20 years are desirable for solar radiation-based electrical power generating systems. With this in mind, the term "fingers" is understood herein to mean any elongate elements that are capable of achieving these objectives.

The above-described fingers make it possible to accommodate variations in thermal expansion coefficients between the fingers and other components of the photovoltaic cell assembly, while continuing to support the photovoltaic cell assembly and to transfer heat effectively from the assembly.

The heat extraction assembly may be located wholly behind and does not extend laterally beyond the exposed surface area of the photovoltaic cell assembly.

The module may be formed so that heat transfer from the photovoltaic cell assembly is at least predominantly through the fingers.

The coolant chamber of the heat extraction assembly may be defined by (a) a housing that comprises a base and side walls extending from the base and (b) the photovoltaic cell assembly connected to upper ends of the side walls of the housing.

The side walls may have similar flexibility as the fingers. More particularly, the side walls may be sufficiently flexible to accommodate differences in thermal expansion coefficient between the photovoltaic cell assembly and the side walls.

The flexibility of the side walls may be due to wall thickness and/or length.

Alternatively or in addition the flexibility of the side walls may be due partially or wholly to a structural connection between the side walls and the photovoltaic cell assembly. The purpose of the structural connection is to translate a significant portion of the stress (normally carried by a relatively small and weak solder joint as a shear force) to the side walls where the force is distributed over a larger area which reduces the strain and the likelihood of failure in the photovoltaic cell assembly or other parts of the module.

By way of example, the structural connection may be a key way arrangement. The key way arrangement may be an arrangement in which an under surface of the photovoltaic cell assembly has a recessed section that receives and retains the upper ends of the side walls. Such a structural connection substantially relieves shear stress in a bond layer (typically solder) that is typically provided between the side walls and the photovoltaic cell assembly. The structural connection translates relative movement via compressive forces rather than shear forces (which is easier for a weaker material like solder to accommodate without failure). The key way arrangement is also advantageous because it facilitates manufacture of the assembly. More particularly, the key way arrangement facilitates self-alignment in the manufacturing process.

The components of the module may be made from a number of different materials ranging from metals to ceramic materials. For example, the heat extraction assembly may include cermet or ceramic components that have thermal expansion coefficients that are matched to the thermal expansion coefficient of the photovoltaic cell assembly. For example, the side walls of the housing may be formed from these materials.

The coolant member may comprise a partition that divides the chamber into a first compartment that is partly defined by the photovoltaic cell assembly and a second compartment that functions as a manifold for coolant flow into and from the first compartment, and with the fingers extending from the partition within the first compartment to the photovoltaic cell assembly.

The partition may comprise a plurality of inlet openings and a plurality of outlet openings to allow coolant flow between the compartments, with the second compartment comprising a pathway for coolant flow from the chamber inlet into the first compartment via the partition inlet openings and a plurality of parallel pathways for heated coolant flow from the first compartment to the chamber outlet via the partition outlet openings.

The fingers and the openings in the partition may be arranged so that there is substantially the same heat transfer from the fingers to the coolant across the surface area of the photovoltaic cells.

The fingers and the openings in the partition may be arranged to define multiple flow paths for coolant flow within the first compartment for heat transfer from the fingers to the coolant and removal of the heated coolant into the second compartment.

The flow paths may be substantially the same length.

The partition may be in the form of a plate or a similar planar element.

The ratio of the volume of the first compartment that is occupied by the fingers and the volume of the remainder of the first compartment may be in a range of 10:90 to 90:10.

The range may be 30:70 to 70:30.

The range may be 45:55 to 55:45.

The aspect ratio of the length of the fingers to the average transverse cross-sectional area of the fingers may be at least 1:1.

The ratio may be at least 5:1.

The ratio may be at least 10:1.

In any given situation, the optimum selections for the volume ratio range and the aspect ratio range of the fingers will depend on the selection of the material from which the fingers are made and more particularly the structural properties, such as flexibility, within the operating temperature range of the module.

Any suitable high thermal conductivity material may be used for the fingers. One suitable material is copper. Another suitable material is a cermet of copper and aluminium nitride. Other suitable materials include metal alloys such as iron-nickel-cobalt alloys (such as alloys sold under the Registered Trademark KOVAR).

The optimum materials selection for the fingers or other parts of the coolant member (such as the external side walls which are subject to maximum stress) may be based on matching thermal expansion coefficient of the fingers to the thermal expansion coefficient of the photovoltaic cell assembly.

The coolant member may include a first array of fingers that is optimised for heat transfer from the fingers to the coolant and a second array of fingers that is optimised for matching thermal expansion coefficient to the thermal expansion coefficient of the photovoltaic cell assembly.

The fingers may be uniformly spaced apart.

The fingers may be uniformly spaced apart in the first compartment.

The fingers may be any suitable length and may be any transverse cross-section.

By way of example, the fingers may be a constant cross-section along the length of the fingers. Alternatively, the cross-section may vary along the length.

In addition, the transverse cross-section of the fingers may be selected to maximise the surface area of the fingers for heat transfer from the fingers to the coolant.

For example, the transverse cross-section of the fingers may be a petal-shaped cross-section.

By way of further example, the fingers may have a rough or textured surface or otherwise be formed to maximise the surface area of the fingers for heat transfer from the fingers to the coolant. For example, the fingers may be formed with patterns of formations on the surface of the fingers that significantly increase the surface area for heat transfer.

The fingers may also be formed to influence coolant flow patterns proximate the fingers to maximise heat transfer from the fingers to the coolant.

The fingers may be soldered, brazed or sintered to the photovoltaic cell assembly.

The photovoltaic cell assembly may include a protective cover, such as a glass cover, that is transparent to solar radiation on the photovoltaic cell or cells of the assembly.

The photovoltaic cell assembly may comprise a substrate that supports the photovoltaic cell or cells of the assembly.

The substrate may comprise a layer of an electrical insulation material.

The substrate may also comprise a metallised layer of a metal or a metal-containing material on opposite faces of the electrical insulation material layer.

One of the metallised layers may be secured (for example thermally bonded) to the photovoltaic cells.

The other metallised layer may be secured (for example thermally bonded) to the heat extraction assembly.

The other metallised layer may be secured to the side walls of the housing of the heat extraction assembly.

The other metallised layer may be secured to the fingers.

The upper surface of the other metallised layer may include a plurality of grooves to accommodate strain resulting from connection between the cover and the substrate.

The photovoltaic cell assembly may comprise a single support substrate and a plurality of photovoltaic cells secured to the substrate.

The photovoltaic cell assembly may comprise a plurality of substrates and one or more than one photovoltaic cell secured to each substrate. With this arrangement, when the module is a large module, each substrate can accommodate thermal expansion coefficient variations separately of the other substrates.

The photovoltaic cell assembly may comprise a seal of a suitable material around an outer edge of the assembly.

The edge seal may be formed in any suitable way.

For example, the edge seal may be formed by pouring a suitable liquid sealant material over the photovoltaic cell assembly so that the sealant material covers the cell or cells and forms the edge seal around the perimeter of the cell or cells and bonds to the substrate, and positioning the protective cover on the cell or cells. The edge seal may be formed by using a removable mould which contains the liquid sealant material to the perimeter of the substrate and up to the height of the protective cover.

By way of further example, the edge seal may be formed by forming the substrate with an upstanding outer edge that defines a weir for the liquid sealant material, (a) pouring the sealant material over the photovoltaic cell assembly so that the sealant material covers the cell or cells and fills the volume defined by the upstanding outer edge, and (b) positioning the protective cover on the cell or cells. The upstanding outer edge may be formed with an internal ledge for locating the protective cover.

By way of further example, the edge seal may be formed by (a) positioning a band having an internal groove around the perimeter of the substrate, with the internal groove locating the band properly on the substrate, and with the band having an upstanding section that defines a weir for the liquid sealant material, (b) pouring the sealant material over the photovoltaic cell assembly so that the sealant material covers the cell or cells and fills the volume defined by the upstanding section, and (c) positioning the protective cover on the cell or cells. The upstanding section may be formed with an internal ledge for locating the protective cover.

The edge seal may be profiled to match other components of the module.

The edge seal may act as a spacer to position a protective cover (described below) of the photovoltaic assembly properly.

The edge seal may provide electrical isolation.

The edge seal may be an environmental seal.

Generally, larger modules are better from an economic viewpoint than smaller modules. In addition, one other advantage of larger modules is that it is possible to have a considerably larger edge seal without increasing the dead space ratio, i.e. the ratio of active area versus non-active area. The larger edge seal is important in terms of high assurance of waterproofness, etc and electrical integrity.

Typically, larger modules make it possible to have an edge seal of at least 0.2 mm wide, typically at least 0.5 mm wide, and more typically at least 0.8 mm wide.

Typically, the edge seal occupies less than 3% of the total exposed surface area of the assembly.

The larger modules may have an exposed surface area of at least 5 cm×5 cm, typically at least 7 cm×7 cm, more typically at least 8 cm×8 cm. The larger modules may have an exposed surface area of less than 30 cm×30 cm, typically less than 50 cm×50 cm.

The photovoltaic cell assembly may comprise a single coolant chamber behind the substrate or multiple substrates.

Alternatively, the photovoltaic cell assembly may comprise a plurality of separate coolant chambers behind the substrate or multiple substrates.

According to the present invention there is also provided a photovoltaic cell module for a receiver of a solar radiation-based electrical power generating system comprising:

(a) a photovoltaic cell assembly that includes at least one photovoltaic cell having an exposed surface for solar radiation, with the exposed surface having an area of at least 5 cm×5 cm, and the assembly having an edge seal that is at least 0.8 mm wide and the edge seal occupies less than 3% of the total exposed surface area of the assembly;

(b) an electrical connection for transferring an electrical energy output of the photovoltaic cell assembly to an output electrical circuit, and (c) an assembly for extracting heat from the photovoltaic cell, the assembly comprising a coolant chamber positioned behind the exposed surface of the photovoltaic cell assembly having a coolant inlet and a coolant outlet for coolant to be supplied into the chamber and for heated coolant to be removed from the chamber and a coolant member located in the coolant chamber to support the photovoltaic cell assembly and to facilitate heat transfer from the assembly to coolant in the chamber located in the coolant chamber.

The edge seal may be formed in any suitable way.

For example, the edge seal may be formed by (a) pouring a suitable liquid sealant material over the photovoltaic cell assembly so that the sealant material covers the cell or cells and forms the edge seal around the perimeter of the cell or cells and bonds to the substrate and (b) positioning the protective cover on the cell or cells. The edge seal may be formed by using a removable mould which contains the liquid sealant material to the perimeter of the substrate and up to the height of the protective cover.

By way of further example, the edge seal may be formed by forming the substrate with an upstanding outer edge that defines a weir for the liquid sealant material, (a) pouring the sealant material over the photovoltaic cell assembly so that the sealant material covers the cell or cells and fills the volume defined by the upstanding outer edge, and (b) positioning the protective cover on the cell or cells. The upstanding outer edge may be formed with an internal ledge for locating the protective cover.

By way of further example, the edge seal may be formed by (a) positioning a band having an internal groove around the perimeter of the substrate, with the internal groove locating the band properly on the substrate, and with the band having an upstanding section that defines a weir for the liquid sealant material, (b) pouring the sealant material over the photovoltaic cell assembly so that the sealant material covers the cell or cells and fills the volume defined by the upstanding section, and (c) positioning the protective cover on the cell or cells. The upstanding section may be formed with an internal ledge for locating the protective cover.

The edge seal may be profiled to match other components of the module.

The edge seal may act as a spacer to position a protective cover (described below) of the photovoltaic assembly properly.

The edge seal may provide electrical isolation.

According to the present invention there is also provided an assembly for extracting heat from a photovoltaic cell assembly for a receiver of a solar radiation-based electrical power generating system, the assembling including a coolant chamber and a coolant member in the form of a plurality of heat transfer fingers of high thermal conductivity material that are located in the coolant chamber, the fingers having ends that are in thermal contact with the photovoltaic cell assembly and thereby facilitate heat transfer away from the assembly, the fingers being sufficiently flexible to accommodate differences in thermal expansion coefficient between the object and the fingers, and the fingers having a relatively high surface area for heat transfer from the fingers to coolant that, in use, circulates through the coolant chamber.

According to the present invention there is provided a method of manufacturing the above-described photovoltaic cell module that comprises:

(a) assembling together in one step or in multiple steps (i) the coolant member of the heat extraction assembly, (ii) the housing of the heat extraction assembly, and (iii) the substrate of the photovoltaic cell assembly to form the coolant chamber of the heat extraction assembly, (b) securing the photovoltaic cell or cells of the photovoltaic cell assembly to the substrate.

The assembly step or steps may include sintering, soldering or brazing together the fingers of the coolant member and the substrate of the photovoltaic cell assembly.

The assembly step or steps may include sintering, soldering or brazing together the photovoltaic cells and the substrate.

The components of the module may be formed by powder metallurgy techniques including metal injection moulding of metal powders or mixtures of metal and non-metal powders which are sintered.

The above-described sintering, soldering or brazing steps are carried out at elevated temperatures. Depending on the materials selections for the components of the module, the temperatures may be of the order of 1000° C. for the sintering step, 180-450° C. for the soldering step, and 450-800° C. for the brazing step. Cooling from these elevated temperatures may result in residual strain in the coolant member (particularly the fingers) and the housing due to variations in coefficients of thermal expansion of the materials of the module which may deform the assembly. Consequently, the method may include a stress/strain relief step. The stress/strain relief step may include pressing the assembly between two parallel surfaces. The stress/strain relief step may include annealing the assembly.

The method may comprise testing for water-tightness of the connection of the substrate and the coolant chamber before securing the photovoltaic cells to the substrate.

The method may comprise mounting an optically suitable hermetic cover on the exposed surface of the photovoltaic cells of the module.

The method may comprise hermetically sealing the module by potting with an appropriate transparent potant (e.g. silicone).

The method may comprise hermetically sealing the module by using a heat shrink preform of a transparent Teflon (Registered Trademark) material or other suitable material filled with a suitable potant.

The method step of hermetically sealing the module may include forming a seal around an edge of the photovoltaic assembly of the module.

The method may comprise hermetically sealing the module may include removing entrapped air under vacuum.

According to the present invention there is also provided a receiver of a system for generating electrical power from solar radiation which comprises an array of photovoltaic cell modules described above for converting solar energy into electrical energy.

According to the present invention there is also provided a system for generating electrical power from solar radiation which comprises:

(a) a receiver that includes an array of photovoltaic cell modules described above for converting solar energy into electrical energy, (b) an output electrical circuit for transferring the electrical energy output of the photovoltaic cells of the modules to an end-use application for the electrical energy; and (c) a concentrator for concentrating solar radiation onto the photovoltaic cells of the modules of the receiver.

The system may include a control system for controlling the system.

The system may include a monitoring system for monitoring the condition of components of the system.

End-use applications for such large scale power generating systems include remote area power supply for isolated grids, mains grid-connected power, water pumping, telecommunications, crude oil pumping, water purification, and hydrogen generation.

The present invention is described further by way of example with reference to the accompanying drawings, of which.

The Figures show an embodiment of a module 3 in accordance with the present invention that is suitable for use in a solar radiation-based electric power generating system.

By way of example, such a system includes a solar radiation concentrator in the form of a parabolic array of mirrors (not shown) that reflects solar radiation that is incident on the mirrors towards a solar radiation receiver (not shown) in the form of a plurality of photovoltaic cells that are arranged in modules. An electrical circuit (not shown) transfers the electrical energy output of the photovoltaic cells to an end-use application for the electrical energy. End-use applications include remote area power supply for isolated grids, mains grid-connected power, water pumping, telecommunications, crude oil pumping, water purification, and hydrogen generation.

The receiver may be the receiver that is described and claimed in the International application entitled "Receiver" in the name of the applicant lodged the same day as the subject International application. The International application claims priority from Australian provisional application 2010904354, and the disclosure in the specifications of the International application and the provisional application are incorporated herein by cross-reference.

The embodiment of the module 3 shown in the Figures includes:

(a) a photovoltaic cell assembly generally identified by the numeral 5 that includes 16 photovoltaic cells 7 (FIGS. 1 and 3) having an exposed surface for solar radiation;

(b) an electrical connection 9 for transferring an electrical energy output of the photovoltaic cell assembly 5 to an output electrical circuit (not shown), (c) an assembly generally identified by the numeral 11 for extracting heat from the photovoltaic cell;

(d) a control system for controlling the system; and.

(e) a monitoring system for monitoring the condition of components of the system.

The components of the module 3 may be made from a number of different materials ranging from metals to ceramic materials and including mixtures, alloys and cermets of such materials. For example, the heat extraction assembly 11 may include cermet or ceramic components that have thermal expansion coefficients that are matched to the thermal expansion coefficient of the photovoltaic cell assembly 5.

The photovoltaic cell assembly 5 comprises a single support substrate on which the 16 photovoltaic cells 7 are secured. As can best be seen in FIG. 3, the substrate is a multiple layer substrate that includes (a) a layer 14 of an electrical insulation material, such as a ceramic material and (b) metallised layers 15, 17 of a metal or a metal-containing material on opposite faces of the electrical insulation material layer 14 and (c) an optically suitable protective glass cover 19 that is on the 16 photovoltaic cells 7.

Figure 3:
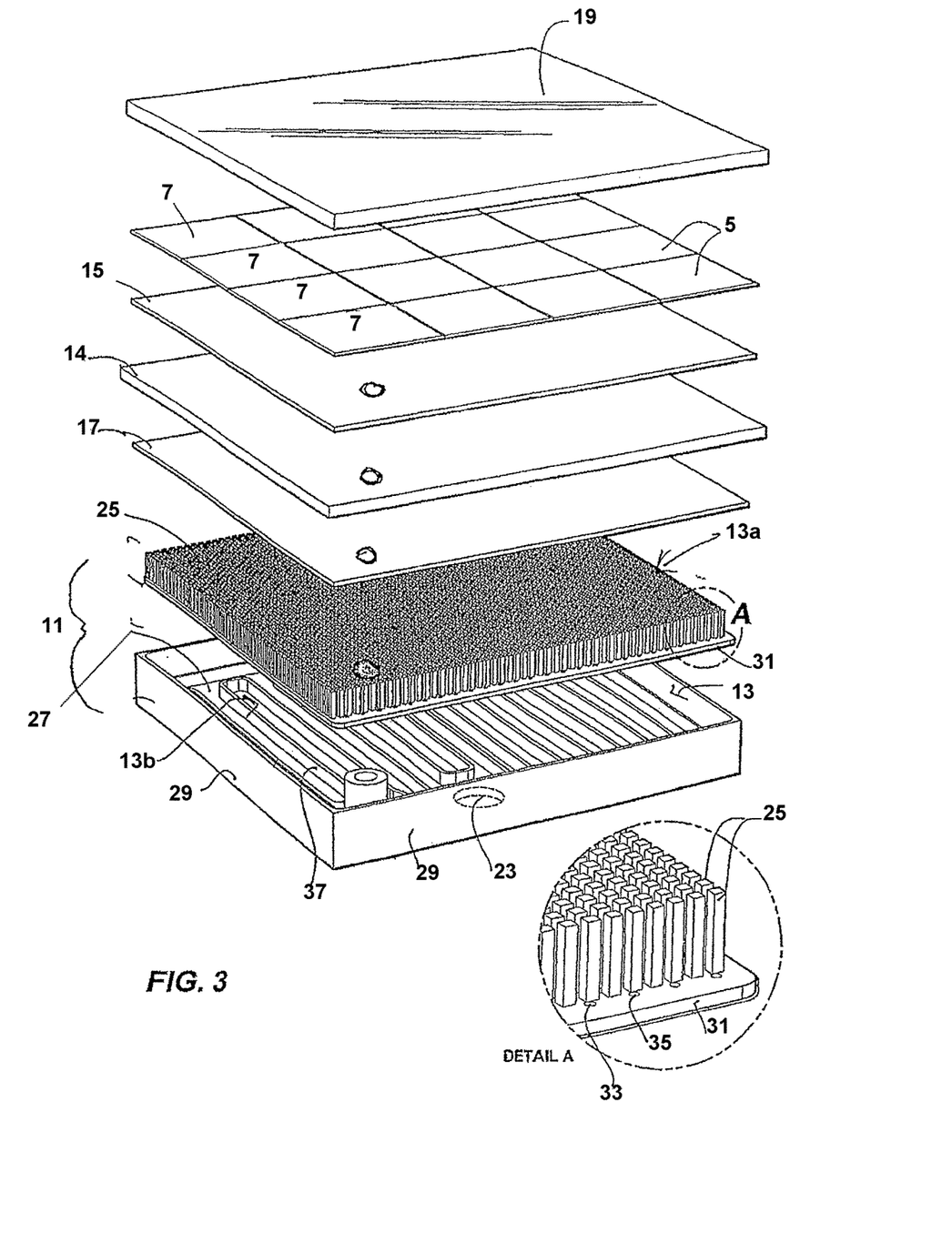
FIG. 3 is an exploded view of the module shown in FIGS. 1 and 2 which illustrate the components of the module.

The 16 photovoltaic cells 7 are secured (for example thermally bonded) to the metallised layer 15. The other metallised layer 17 is secured (for example thermally bonded) to the heat extraction assembly 11. The upper surface of the other metallised layer 17 includes a plurality of grooves (not shown) to accommodate strain resulting from connection between the cover 19 and the substrate.

Figure 7:
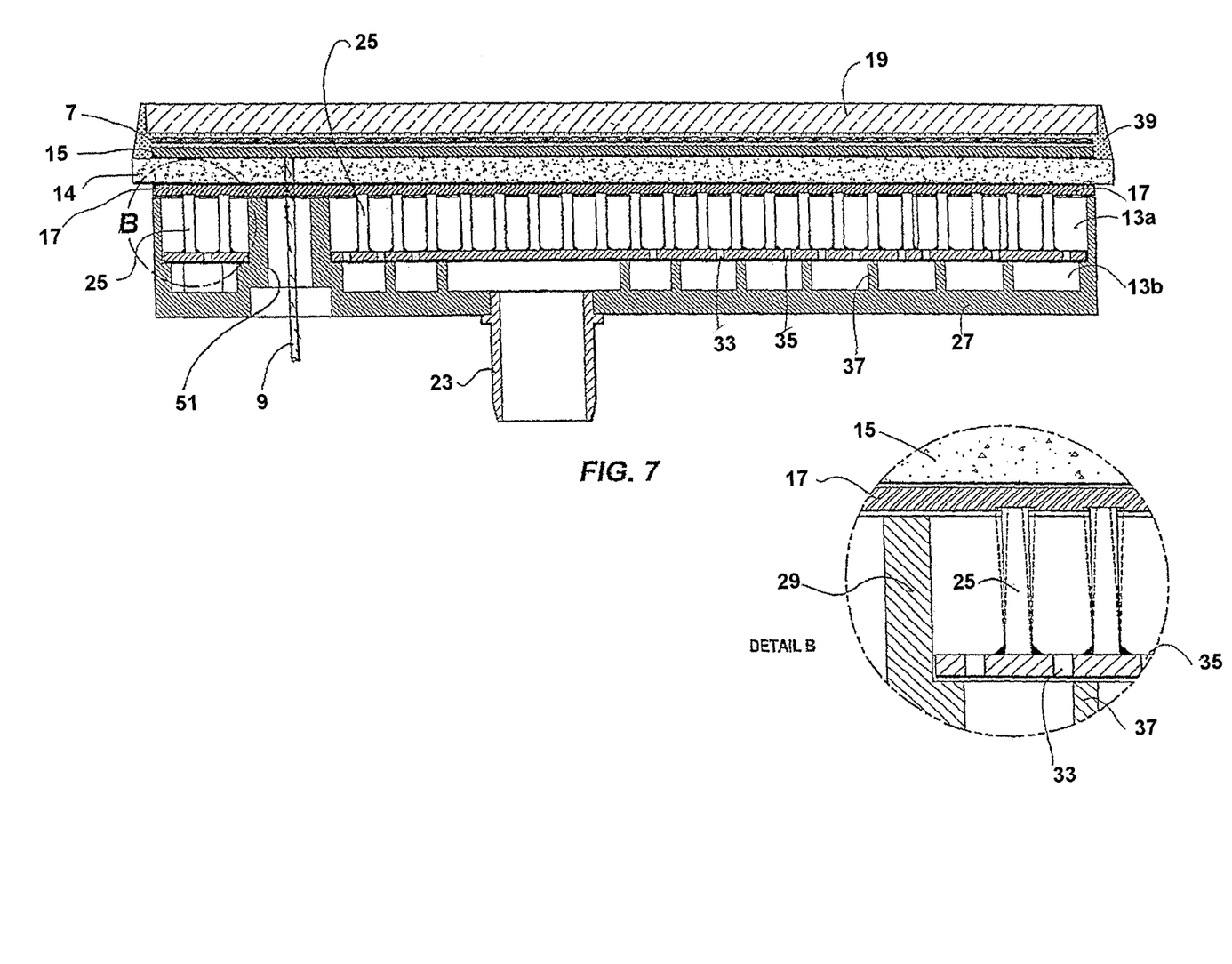
FIG. 7 is a vertical cross section along the line 7-7 in FIG. 1, with the Figure including a detail B.
Figure 8:
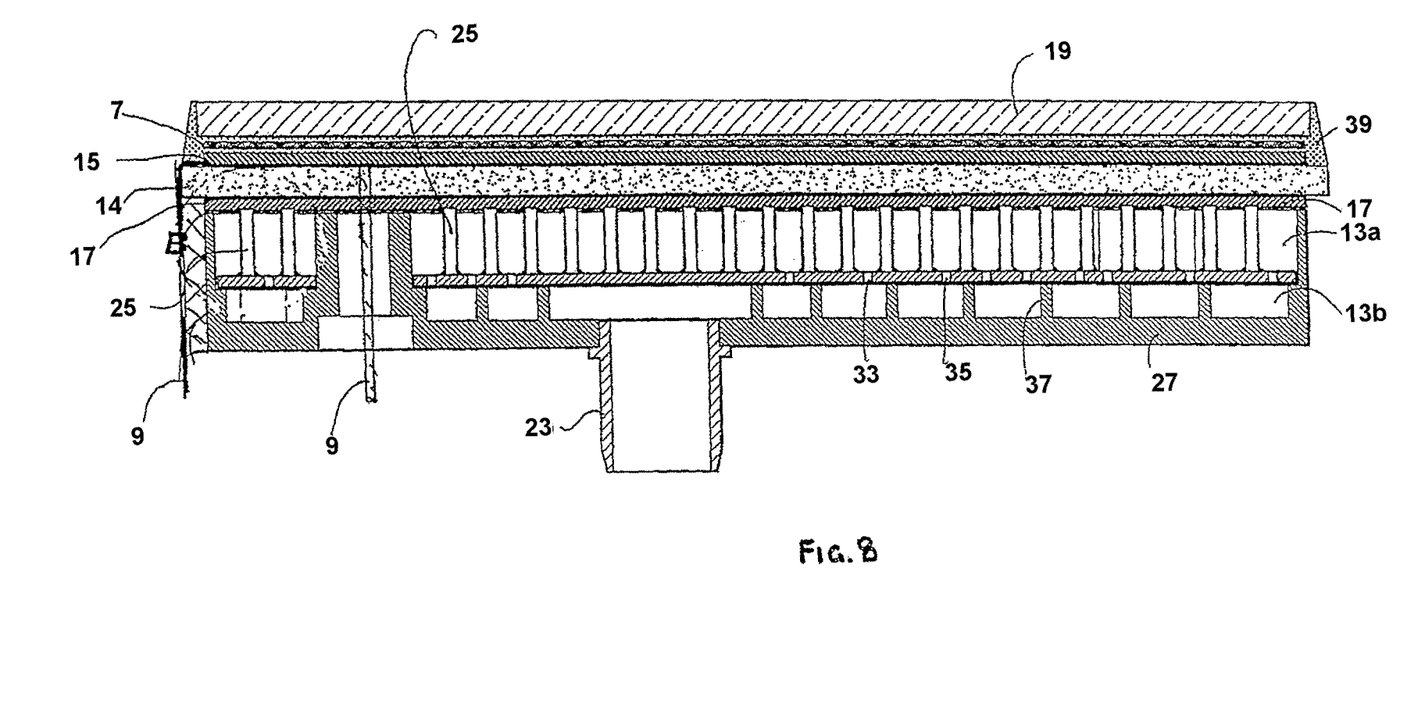
FIG. 8 is a vertical cross-section similar to FIG. 7 which illustrates an edge electrical connection for the module as modification to the arrangement shown in FIG. 7.

As can best be seen in FIG. 7, the electrical connection 9 for the module 3 is in the form of an electrical lead that extends from the metallised layer 15 through an opening 51 in the module 3. FIG. 8 illustrates an alternative arrangement in which there is an electrical lead 9 extending from the edge of the module 3.

The heat extraction assembly 11 comprises a coolant chamber positioned behind the exposed surface of the photovoltaic cell assembly 5. The coolant chamber has a coolant inlet 21 and a coolant outlet 23 for coolant (typically water) to be supplied into the chamber and for heated coolant to be removed from the chamber. The coolant chamber is defined by (a) a housing that comprises a base 27 and side walls 29 extending from the base 27 and (b) the photovoltaic cell assembly 5 connected to upper ends of the side walls 29 of the housing.

The heat extraction assembly 11 also includes a coolant member in the form of a plurality of heat transfer fingers 25 of high thermal conductivity material located in the chamber. The fingers 25 have upper ends that are connected directly to the metallised layer 17 of the photovoltaic cell assembly 5. The fingers 25 support the photovoltaic cell assembly 5 and transfer heat from the photovoltaic cell assembly 5 to coolant in the coolant chamber. The fingers 25 are formed to be sufficiently flexible to accommodate differences in thermal expansion coefficient between the photovoltaic cell assembly 5 and the fingers 25. In addition, the fingers 25 are formed to have a relatively high surface area for heat transfer from the fingers 25 to coolant circulating through the coolant chamber.

The fingers 25 are uniformly spaced apart and are a constant cross-section along the length of the fingers 25. The present invention is not limited to this arrangement. Alternatively, the cross-section may vary along the length. In addition, the transverse cross-section of the fingers 25 may be selected to maximise the surface area of the fingers 25 for heat transfer from the fingers to the coolant. For example, the transverse cross-section of the fingers 25 may be a petal-shaped cross-section. By way of further example, the fingers 25 may have a rough or textured surface or otherwise be formed to maximise the surface area of the fingers 25 for heat transfer from the fingers 25 to the coolant. For example, the fingers 25 may be formed with patterns of formations on the surface of the fingers that significantly increase the surface area for heat transfer.

The side walls 29 of the chamber have similar flexibility as the fingers. More particularly, the side walls are sufficiently flexible to accommodate differences in thermal expansion coefficient between the photovoltaic cell assembly and the side walls and the bulk of the heat extraction assembly 11. The flexibility of the side walls 29 may be due to wall thickness and/or length and/or side wall material type. Alternatively or in addition the flexibility of the side walls 29 may be due partially or wholly to a structural connection between the side walls and the photovoltaic cell assembly that provides flexibility between the side walls and the photovoltaic cell assembly. By way of example, the structural connection may be a key way arrangement. The key way arrangement may be an arrangement in which an under surface of the photovoltaic cell assembly has a recessed section that receives and retains the upper end of the side walls. Such a structural connection substantially relieves shear stress in a bond layer (typically solder) that is typically provided between the side walls and the photovoltaic cell assembly. The structural connection accommodates relative movement via compressive forces rather than shear forces. The purpose of the structural connection is to translate a significant portion of the stress (normally carried by a relatively small and weak solder joint as a shear force) to the side walls where the force is distributed over a larger area which reduces the strain and the likelihood of failure in the photovoltaic cell assembly or other parts of the module. The key way arrangement is also advantageous because it facilitates manufacture of the assembly. More particularly, the key way arrangement facilitates self-alignment in the manufacturing process.

The coolant member also comprise a partition 31 in the form of a flat plate that divides the coolant chamber into a first compartment 13a that is partly defined by the photovoltaic cell assembly 5 and a second compartment 13b that functions as a manifold for coolant flow into and from the first compartment 13a. The fingers 25 extend from the partition 31 within the first compartment 13a to the photovoltaic cell assembly 5.

The partition 31 comprises a plurality of inlet openings 33 and a plurality of outlet openings 35 to allow coolant flow between the compartments 13a, 13b. The fingers 25 and the openings 33, 35 in the partition 31 are arranged so that there is substantially the same heat transfer from the fingers 25 to the coolant across the surface area of the photovoltaic cells 7. The fingers 25 and the openings 33, 35 in the partition 31 define multiple flow paths for coolant flow within the first compartment 13a for heat transfer from the fingers 25 to the coolant and removal of the heated coolant into the second compartment 13b. Preferably the pathways are the same length. This does not have to be the case. The second compartment 13b comprises a pathway for coolant flow from the chamber inlet 21 into the first compartment 13a via the partition inlet openings 33. The second compartment 13b comprises a separate pathway for heated coolant flow from the first compartment 13a to the chamber outlet 23 via the partition outlet openings 35. The pathways are defined by internal walls 37 in the second compartment 13b.

The ratio of the volume of the first compartment 13a that is occupied by the fingers 25 and the volume of the remainder of the first compartment 13a is in a range of 10:90 to 90:10, typically 30:70 to 70:30, and more typically 45:55 to 55:45. The aspect ratio of the length of the fingers 25 to the average transverse cross-sectional area of the fingers 25 is at least 1:1, typically at least 5:1, and more typically at least 10:1. In any given situation, the optimum selections for the volume ratio range and the aspect ratio range of the fingers will depend on the selection of the material from which the fingers 25 are made and more particularly the structural properties, such as flexibility, within the operating temperature range of the module 3.

Any suitable high thermal conductivity material may be used for the fingers 25. One suitable material is copper. Another suitable material is a cermet of copper and aluminium nitride. Other suitable materials include metal alloys such as iron-nickel-cobalt alloys (such as alloys sold under the registered trade mark KOVAR).

The optimum materials selection for the fingers 25 or other parts of the coolant member (such as the external side walls 29 which are subject to maximum stress) may be based on matching thermal expansion coefficient of the fingers 25 to the thermal expansion coefficient of the photovoltaic cell assembly 5.

The coolant member may include a first array of fingers 25 that is optimised for heat transfer from the fingers 25 to the coolant and a second array of fingers 25 that is optimised for matching thermal expansion coefficient to the thermal expansion coefficient of the photovoltaic cell assembly.

The above-described module can be manufactured in a straightforward manner by:

(a) assembling together in one step or in multiple steps (i) the coolant member (i.e. the partition 31 and the fingers 25) of the heat extraction assembly 11, (ii) the housing (i.e. the base 27 and the side walls 29 and the internal walls 37) of the heat extraction assembly 11, and (iii) the substrate (i.e. the layers 15, 17, 19) of the photovoltaic cell assembly 5 to form the coolant chamber of the heat extraction assembly 11.

(b) securing the 16 photovoltaic cells 7 of the photovoltaic cell assembly 5 to the metallised layer 15 of the substrate.

The above steps include sintering, soldering or brazing together the fingers 25 of the coolant member and the metallised layer 17 of the substrate of the photovoltaic cell assembly 5. The above steps also include sintering, soldering or brazing together the photovoltaic cells 7 and the metallised layer 15 of the substrate.

The method also comprises hermetically mounting the optically suitable protective cover 19 on the exposed surface of the photovoltaic cells of the module.

The method also comprises hermetically sealing the module 3 by potting with an appropriate transparent potant (e.g. silicone) or other suitable sealant material and, as part of this process forming an edge seal 39. It is noted here that constructing the module 3 as a large module, i.e. at least 8 cm×8 cm and positioning the 16 photovoltaic cells 7 on the substrate as a close-packed array means that the edge seal of the module 3 can be a relatively substantial seal, typically at least 0.5 mm, more typically at least 0.9 mm, and therefore an effective seal without sacrificing the total area exposed to solar radiation when compared to assemblies that have smaller modules.

Figure 1:
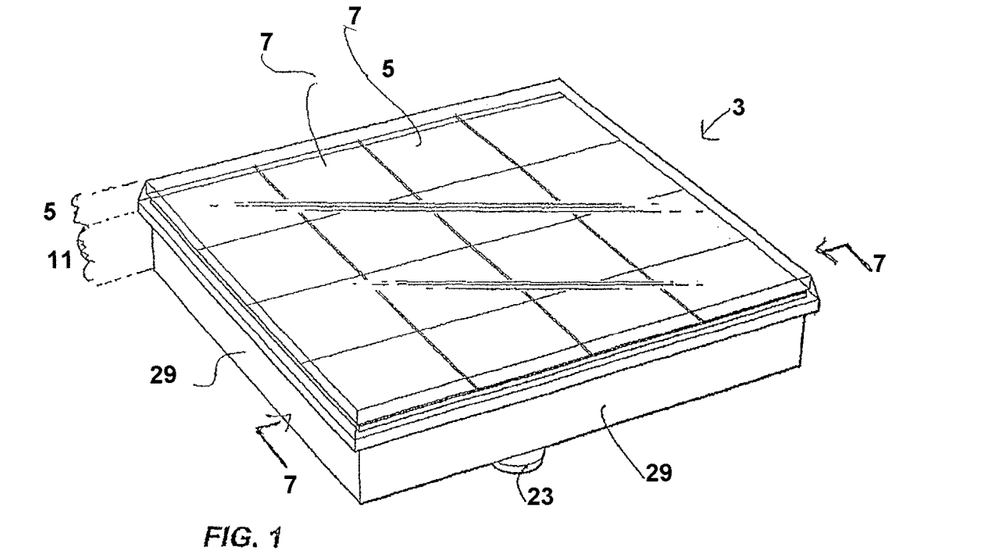
FIG. 1 is a perspective view of one embodiment of a photovoltaic cell module of a receiver of a solar radiation-based electric power generating system in accordance with the present invention.
Figure 2:
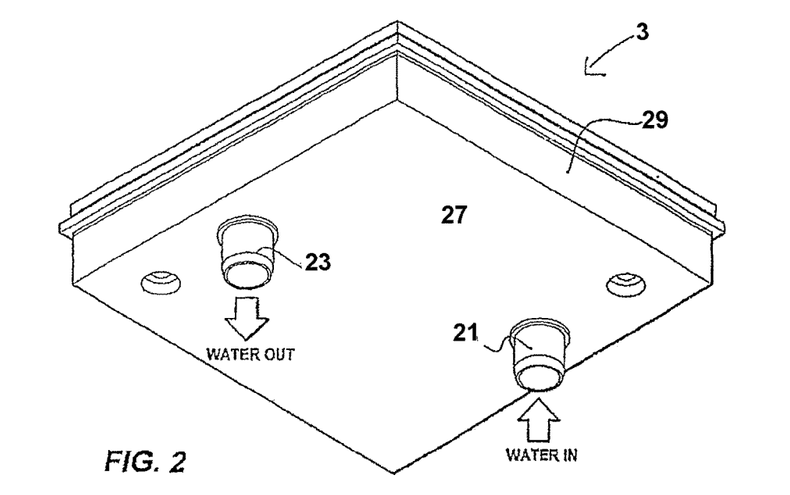
FIG. 2 is another perspective view of the module shown in FIG. 1.
Figure 4:
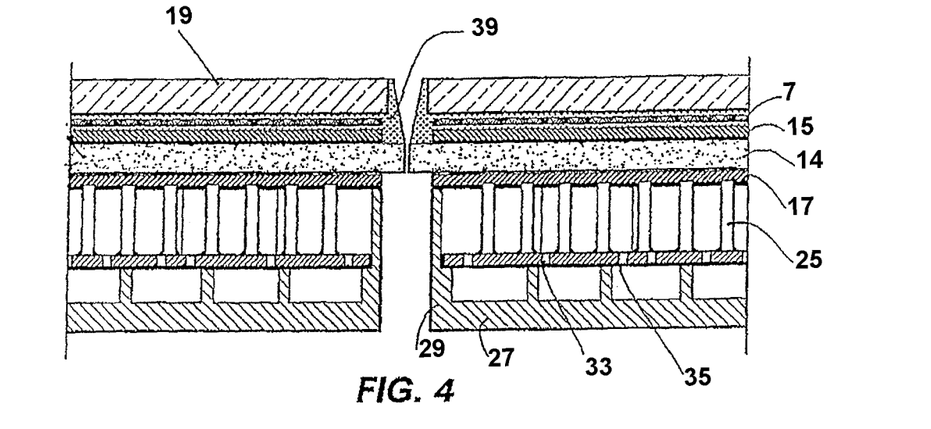
FIG. 4 is a vertical cross section that illustrates two adjacent modules of the type shown in FIG. 1 positioned side by side in a receiver.
Figure 5:
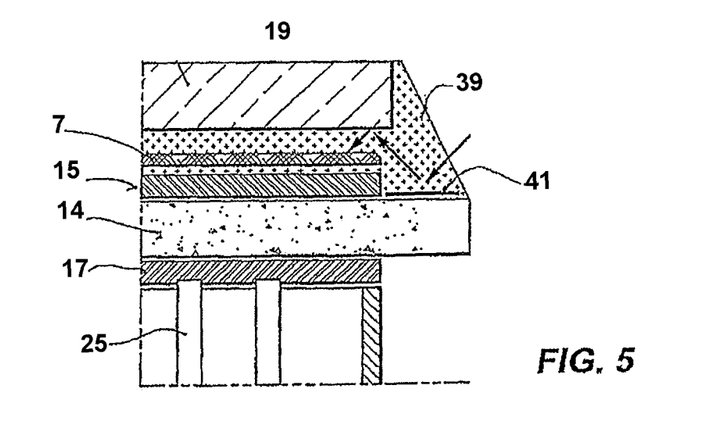
FIG. 5 is a detailed view of the upper right hand side of the module shown on the left hand side of FIG. 4 illustrating the construction of the upper right hand side of the module, including an edge seal.
Figure 6:
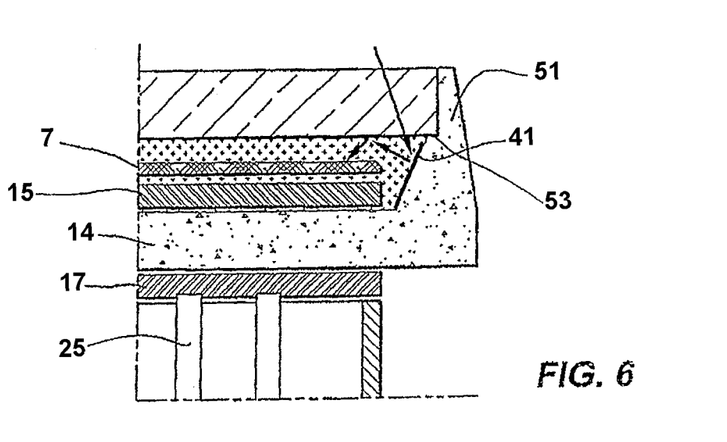
FIG. 6 is a detailed view similar to FIG. 5 but illustrating a modification of the upper right hand side of the module.

FIG. 4 is a vertical cross section that illustrates two adjacent modules 3 of the type shown in FIG. 1 positioned side by side in a receiver. FIG. 5 is a detailed view of the upper right hand side of the module 3 shown on the left hand side of FIG. 4 illustrating the construction of the upper right hand side of the module, and more particularly the edge seal 39, and incorporating a feature of a reflective surface 41 discussed below. FIG. 6 is a modification of the FIG. 5 arrangement.

FIGS. 5 and 6 illustrate two types of edge seal 39.

The edge seal 39 in FIG. 5 is formed by (a) pouring a suitable liquid sealant material over the photovoltaic cell assembly so that the sealant material covers the cell or cells and forms the edge seal 39 around the perimeter of the cell or cells and bonds to the layer 14 of the support substrate and (b) positioning the protective cover 19 on the cell or cells. The edge seal 39 may be formed by using a removable mould which contains the liquid sealant material to the perimeter of the substrate and up to the height of the protective cover.

The edge seal 39 in FIG. 6 is formed by forming the layer 14 of the support substrate with an upstanding outer edge 51 that defines a weir for the liquid sealant material, (a) pouring the sealant material over the photovoltaic cell assembly so that the sealant material covers the cell or cells and fills the volume defined by the upstanding outer edge, and (b) positioning the protective cover 19 on the cell or cells. The upstanding outer edge 41 may be formed with an internal ledge 53 for locating the protective cover.

By way of further example (not shown in the Figures), the edge seal may be formed by (a) positioning a band having an internal profile such as an internal groove around the perimeter of the substrate, with the internal groove locating the band properly on the substrate, and with the band having an upstanding section that defines a weir for the liquid sealant material, (b) pouring the sealant material over the photovoltaic cell assembly so that the sealant material covers the cell or cells and fills the volume defined by the upstanding section, and (c) positioning the protective cover on the cell or cells. The upstanding section may be formed with an internal ledge for locating the protective cover.

It is evident from FIGS. 4 and 5 that there is a dead space between the adjacent modules 3 that does not include photovoltaic cells 7. In order to reduce the potential loss of solar radiation, FIGS. 4 and 5 illustrate that the module 3 may be formed with reflective surfaces 41 that reflect solar radiation in these edge regions so that the radiation can be directed to the photovoltaic cells 7.

Many modifications may be made to the preferred embodiment described above without departing from the spirit and scope of the present invention.

By way of example, whilst the embodiment of the module 3 described above is described in the context of a large scale solar radiation-based electrical power generating system, the present invention is not so limited and extends to small scale systems such as roof-mounted systems for domestic or commercial electrical power generation.

In addition, whilst the solar radiation-based electric power generating system described above includes a parabolic array of mirrors, the present invention is not so limited and extends to other options, such as an array of heliostats, for reflecting and concentrating solar radiation onto a receiver.

The invention claimed is:

1. A photovoltaic cell module for a receiver of a solar radiation-based electrical power generating system comprising:
   (a) a photovoltaic cell assembly that includes at least one photovoltaic cell having an exposed surface for solar radiation;
   (b) an electrical connection for transferring an electrical energy output of the photovoltaic cell assembly to an output electrical circuit, and
   (c) an assembly for extracting heat from the photovoltaic cell, the assembly comprising a coolant chamber positioned behind the exposed surface of the photovoltaic cell assembly and being defined by (a) a housing that comprises a base and side walls extending from the base and (b) the photovoltaic cell assembly connected to upper ends of the side walls of the housing, and the coolant chamber having a coolant inlet and a coolant outlet for coolant to be supplied into the chamber and for heated coolant to be removed from the chamber and a coolant member located in the coolant chamber to support the photovoltaic cell assembly and to facilitate heat transfer from the assembly to coolant in the chamber located in the coolant chamber, the coolant member comprising a plurality of heat transfer fingers of high thermal conductivity material having ends that are connected directly or indirectly to the photovoltaic cell assembly and supporting the photovoltaic cell assembly and for transferring heat from the photovoltaic cell assembly to coolant in the coolant chamber, the coolant member further comprising a partition that divides the chamber into a first compartment that is partly defined by the photovoltaic cell assembly and a second compartment that functions as a manifold for coolant flow into and from the first compartment, and with the fingers extending from the partition within the first compartment to the photovoltaic cell assembly, the fingers being sufficiently flexible to accommodate differences in thermal expansion coefficient between the photovoltaic cell assembly and the fingers and having a relatively high surface area for heat transfer from the fingers to coolant circulating through the coolant chamber, and the side walls being sufficiently flexible to accommodate differences in thermal expansion coefficient between the photovoltaic cell assembly and the side walls.

2. The module defined in claim 1 wherein the heat extraction assembly is located wholly behind and does not extend laterally beyond the exposed surface area of the photovoltaic cell assembly.

3. The module defined in claim 1 being formed so that heat transfer from the photovoltaic cell assembly is at least predominantly through the fingers.

4. The module defined in claim 1 includes a structural connection between the side walls and the photovoltaic cell assembly that provides support that transfers strain to the side walls and the photovoltaic cell assembly.

5. The module defined in claim 1 wherein the partition comprises a plurality of inlet openings and a plurality of outlet openings to allow coolant flow between the compartments, with the second compartment comprising a pathway for coolant flow from the chamber inlet into the first compartment via the partition inlet openings and a plurality of parallel pathways for heated coolant flow from the first compartment to the chamber outlet via the partition outlet openings.

6. The module defined in claim 5 wherein the fingers and the openings in the partition are arranged so that there is substantially the same heat transfer from the fingers to the coolant across the surface area of the photovoltaic cells.

7. The module defined in claim 5 wherein the fingers and the openings in the partition are arranged to define multiple flow paths for coolant flow within the first compartment for heat transfer from the fingers to the coolant and removal of the heated coolant into the second compartment.

8. The module defined in claim 1 wherein the ratio of the volume of the first compartment that is occupied by the fingers and the volume of the remainder of the first compartment is in a range of 10:90 to 90:10.

9. The module defined in claim 1 wherein the aspect ratio of the length of the fingers to the average transverse cross-sectional area of the fingers is at least 1:1.

10. The module defined in claim 1 wherein the coolant member includes a first array of fingers that is optimised for heat transfer from the fingers to the coolant and a second array of fingers that is optimised for matching thermal expansion coefficient to the thermal expansion coefficient of the photovoltaic cell assembly.

11. The module defined in claim 1 wherein the photovoltaic cell assembly comprises a single support substrate and a plurality of photovoltaic cells secured to the substrate.

12. The module defined in claim 1 wherein the photovoltaic cell assembly comprises a plurality of substrates and one or more than one photovoltaic cell secured to each substrate.

13. The module defined in claim 1 wherein the photovoltaic cell assembly comprises a single coolant chamber behind the substrate or multiple substrates.

14. The module defined in claim 1 wherein the photovoltaic cell assembly comprises a plurality of separate coolant chambers behind the substrate or multiple substrates.

15. A method of manufacturing the photovoltaic cell module defined in claim 1 comprising:
  (a) assembling together in one step or in multiple steps (i) the coolant member of the heat extraction assembly, (ii) the housing of the heat extraction assembly, and (iii) the photovoltaic cell assembly to form the coolant chamber of the heat extraction assembly,
  (b) securing the photovoltaic cell or cells of the photovoltaic cell assembly to the substrate.

16. A system for generating electrical power from solar radiation which comprises:
  (a) a receiver that includes an array of photovoltaic cell modules defined in claim 1 for converting solar energy into electrical energy,
  (b) an output electrical circuit for transferring the electrical energy output of the photovoltaic cells of the modules to an end-use application for the electrical energy; and
  (c) a concentrator for concentrating solar radiation onto the photovoltaic cells of the modules of the receiver.

\* \* \* \* \*

UNITED STATES PATENT AND TRADEMARK OFFICE
CERTIFICATE OF CORRECTION

PATENT NO.        : 9,793,428 B2           Page 1 of 1
APPLICATION NO.   : 13/876634
DATED             : October 17, 2017
INVENTOR(S)       : John Beavis Lasich It is certified that error appears in the above-identified patent and that said Letters Patent is hereby corrected as shown below:

On the Title Page

In item (73) Assignee, please delete "REYGEN RESOURCES PTY LTD" and add
--RAYGEN RESOURCES PTY LTD--

Signed and Sealed this
Twelfth Day of December, 2017

Joseph Matal
*Performing the Functions and Duties of the
Under Secretary of Commerce for Intellectual Property and
Director of the United States Patent and Trademark Office*